(12) United States Patent
Jin et al.

(10) Patent No.: US 6,802,906 B2
(45) Date of Patent: Oct. 12, 2004

(54) EMISSIVITY-CHANGE-FREE PUMPING PLATE KIT IN A SINGLE WAFER CHAMBER

(75) Inventors: Xiaoliang Jin, San Jose, CA (US); Shulin Wang, Campbell, CA (US); Lee Luo, Fremont, CA (US); Henry Ho, San Jose, CA (US); Steven A. Chen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 243 days.

(21) Appl. No.: 10/051,651

(22) Filed: Jan. 15, 2002

(65) Prior Publication Data

US 2002/0127508 A1 Sep. 12, 2002

Related U.S. Application Data

(63) Continuation-in-part of application No. 09/798,424, filed on Mar. 2, 2001, now Pat. No. 6,582,522.
(60) Provisional application No. 60/220,039, filed on Jul. 21, 2000.

(51) Int. Cl.$^7$ ..................... C23C 16/00; H01L 21/306; B05C 13/00
(52) U.S. Cl. ................... 118/715; 118/725; 156/345.29
(58) Field of Search ................................ 118/715, 725; 156/345.29

(56) References Cited

U.S. PATENT DOCUMENTS

| | | | | |
|---|---|---|---|---|
| 5,467,220 A | * | 11/1995 | Xu | 359/350 |
| 5,558,717 A | * | 9/1996 | Zhao et al. | 118/715 |
| 5,582,866 A | * | 12/1996 | White | 427/248.1 |
| 5,846,332 A | * | 12/1998 | Zhao et al. | 118/728 |
| 5,882,419 A | * | 3/1999 | Sinha et al. | 118/729 |
| 5,895,530 A | | 4/1999 | Shrotriya et al. | |
| 5,935,334 A | * | 8/1999 | Fong et al. | 118/723 ME |
| 5,935,338 A | * | 8/1999 | Lei et al. | 118/725 |
| 5,963,840 A | * | 10/1999 | Xia et al. | 438/783 |
| 6,063,198 A | * | 5/2000 | Bang et al. | 118/715 |
| 6,117,244 A | * | 9/2000 | Bang et al. | 118/715 |
| 6,153,261 A | * | 11/2000 | Xia et al. | 427/255.393 |
| 6,165,271 A | * | 12/2000 | Zhao et al. | 118/715 |
| 6,261,408 B1 | * | 7/2001 | Schneider et al. | 156/345.26 |
| 6,301,434 B1 | * | 10/2001 | McDiarmid et al. | 392/416 |
| 6,319,324 B1 | * | 11/2001 | Nguyen et al. | 118/697 |
| 6,395,092 B1 | * | 5/2002 | Sugiarto et al. | 118/695 |
| 6,423,949 B1 | * | 7/2002 | Chen et al. | 219/444.1 |
| 6,530,992 B1 | * | 3/2003 | Yang et al. | 118/695 |
| 6,559,039 B2 | * | 5/2003 | Wang et al. | 438/542 |
| 6,582,522 B2 | * | 6/2003 | Luo et al. | 118/715 |
| 6,586,343 B1 | * | 7/2003 | Ho et al. | 438/758 |
| 2001/0035131 A1 | * | 11/2001 | Sakuma et al. | 118/724 |
| 2002/0127508 A1 | * | 9/2002 | Jin et al. | 432/93 |
| 2002/0137312 A1 | * | 9/2002 | Luo et al. | 438/492 |

FOREIGN PATENT DOCUMENTS

| | | |
|---|---|---|
| EP | 0909836 A2 | 4/1999 |
| WO | WO 01/04937 A2 * | 1/2001 |
| WO | WO 01/004376 A1 * | 1/2001 |
| WO | WO 02/08489 A3 * | 1/2002 |
| WO | WO 03/060189 A1 * | 7/2003 |

OTHER PUBLICATIONS

"Uniform Heating in CVD Reactors", Research Disclosure, Kenneth Mason Publications, Hampshire, GB, No. 354, Oct. 1, 1993, p. 658 (1 page), Disclosed anonymously.*
Search Report for PCT/US 03/01347, mailed Jun. 30, 2003, 5 pages.*
PCT Search Report, Feb. 19, 2002, 7 pages.

* cited by examiner

Primary Examiner—Jeffrie R. Lund
(74) Attorney, Agent, or Firm—Blakely Sokoloff Taylor & Zafman

(57) ABSTRACT

An apparatus that includes a pumping plate having a skirt, where the skirt contains a number of holes and a wafer access slot, and where the number of holes are sized and positioned to provide uniform heating of a susceptor.

24 Claims, 15 Drawing Sheets

| MEAN | 1138.6 | | WAFER DIAM | 200.00 |
|---|---|---|---|---|
| STD DEV | 15.597 | 1.370% | TEST DIAM | 194.00 |
| MINIMUM | 1111.1 | | TEMPLATE MAP | 49 SITE |
| MAXIMUM | 1172.4 | | CONTOUR DISP | STD |
| # SITES/GOOD | 49/49 | | INTERVAL | 1.000 |
| SUBSTRATE | 50MM (275 μ) Si | | LAYER 2 FILM | POLY Si |
| SORTING SIGMA | 3.0 | | MEAN-TARGET | 0.000 |
| CORRELATION | * NONE | | WARNING | 0.000 |
| UNITS | ANGSTROMS | | SPEC | 0.000 |

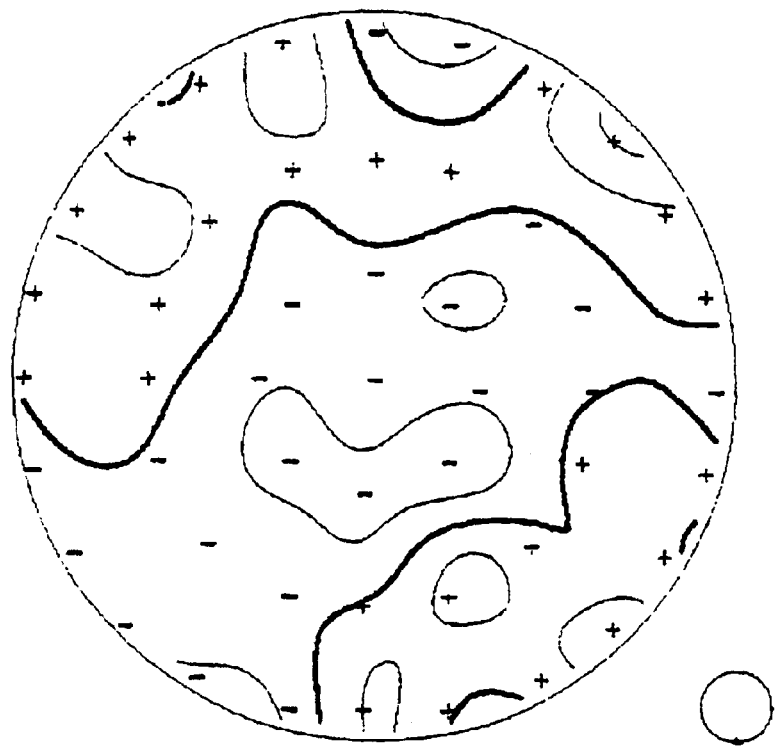

- GOF Error
- ▲ Sigma Error
- ■ Meausrement Error
- — Below Calculated Mean
- + Above Calculated Mean

| | | | |
|---|---|---|---|
| Wafer Diameter | 200 mm | Limits: | Percent |
| Edge Exclusion | 3.000 mm | Mean Target | 0.00 Å |
| Type/Pattern | Polar/49 Site Map | U/L Control | 20.0%/20.0% |
| # Sites/Good | 49/49 | U/L Warning | 5.0%/5.0% |
| Measurement | 2$^{nd}$ Thickness | U/L Sigma | 3.00/3.00 |
| Mean | 1318.29 Å | Stdv Control | 1.000 |
| Std. Deviation | 10.5104 Å / 0.797% | Contour Display | Percent |
| Minimum | 1300.49 Å | Interval | 11.0962 |
| Maximum | 1341.45 Å | | |
| Range | 40.95 | Film Stack | Ox/aSi/Ox-T, T&n&k, T Copy |
| | | Layer 3 | Themal SiO2 |
| | | Layer 2 | # Amorphous Si |
| | | Layer 1 | Themal SiO2 |
| | | Substrate | Silicon |

FIG.3

EMISSIVITY-CHANGE-FREE PUMPING PLATE KIT IN A SINGLE WAFER CHAMBER

CROSS-REFERENCE TO RELATED APPLICATION

This is a continuation in part of U.S. application Ser. No. 09/798,424, filed Mar. 2, 2001 now U.S. Pat. No. 6,582,522, which claims priority to U.S. Provisional Application No. 60/220,039, filed Jul. 21, 2000.

BACKGROUND OF THE INVENTION

1. Field of the Invention

The present invention relates generally to the field of semiconductor manufacturing. More specifically, the present invention relates to an emissivity-change-free pumping plate kit in a single wafer chamber.

2. Description of the Related Art

Chemical vapor deposition, commonly referred to as "CVD," is one of a number of processes used to deposit thin layers of material on a semiconductor wafer, and may be based on thermal, plasma, or optically assisted decomposition, or reaction of chemicals. To process wafers in, for example, a thermal CVD process, a chamber is provided with a susceptor configured to receive a wafer. The wafer is typically placed onto and removed from the susceptor by a robot blade and supported by the susceptor during processing. In these typical prior art systems, the susceptor and the wafer are heated to a temperature of between 200–650° C. prior to processing. Once the wafer is heated to an appropriate temperature, a processing fluid, typically a gas, is introduced into the chamber through a gas manifold often situated above the wafer. The processing gas thermally decomposes upon contact with the heated wafer surface to deposit a thin material layer thereon.

A primary goal of wafer processing is to obtain as many useful dies as possible from each wafer. Many factors affect the ultimate yield of die from each wafer processed. These factors include processing variables, which affect the uniformity and thickness of the material layer deposited on the wafer, and particulate contaminants that can attach to a wafer and contaminate one or more die. Both of these factors must be controlled in CVD and other processes to maximize the die yield from each wafer.

During the deposition, yellow or black powders tend to accumulate inside the chamber (e.g., on the pumping and face plates), which would cause emissivity change in the chamber and further temperature change. After processing certain number of wafers, emissivity change would render the process inconsistent from one wafer to another. Therefore, the prior art is deficient in the lack of effective means or process system that would prevent emissivity change, thereby improve the uniformity of process. Additionally, the prior art is deficient in the lack of an effective means of providing a uniform thermal boundary condition around the wafer heater so as to enhance optimal film thickness uniformity. The present invention fulfills these long-standing needs and desires in the art.

SUMMARY OF THE INVENTION

Provided herein in one aspect of the present invention is an emissivity-change-free pumping plate kit used in a single wafer chamber. This kit comprises a top open pumping plate, wherein there is no restriction to the flow. This kit may further comprise a skirt and/or a second stage choking plate. The skirt may be installed around the wafer heater, underneath the wafer heater, or along the chamber body inside the chamber, while the choking plate is installed downstream of the top open pumping plate along the purge gas flow.

The emissivity-change-free pumping plate kit disclosed herein may be used for preventing emissivity change during wafer processing by providing, in part, a gas purge to the chamber to prevent residual or powder formation on the pumping and face plates, thereby preventing an emissivity change in the chamber. More specifically, the gas purge may flow from the bottom purge or from the showerhead. Furthermore, even with a gas purge, powder formation may occur. Therefore, to reduce powder formation on the pumping and face plates, minimization of exposure to the gas is desirable, i.e., one can facilitate gas exiting between the pumping plate and face plate by using this top open pumping plate kit. The kit may also be used for providing optimal film thickness uniformity during wafer processing.

The invention further discloses a pumping plate having an aft skirt that acts to absorb heat radiated off the susceptor. The pumping plate has a wafer loading slot in the skirt that faces a wafer loading structure (slit valve) in the process chamber. Heat radiating off the susceptor, passing through the wafer loading slot in the pumping plate, enters the slit valve. The slit valve acts to absorb more heat from the susceptor than do other areas of the chamber interior. The susceptor in the area of the slit valve receives less reflected heat and as a result, the susceptor in this area can be cooler. A non-uniformly heated susceptor can effect film deposition onto the wafer and to compensate, a skirt is added to the pumping plate. The skirt is slotted, i.e. has holes to improve absorption by the skirt from heat radiating off the susceptor. The skirt reduces heat reflected back to the susceptor from the chamber walls and this has the effect of balancing the heat loss into the slit valve. With a thermally balanced susceptor, uniform film deposition onto the wafer can result.

Other and further aspects, features, and advantages of the present invention will be apparent from the following description of the embodiments of the invention given for the purpose of disclosure.

BRIEF DESCRIPTION OF THE DRAWINGS

So that the matter in which the above-recited features, advantages and objects of the invention, as well as others which will become clear, are attained and can be understood in detail, more particular descriptions of the invention briefly summarized above may be had by reference to certain embodiments thereof which are illustrated in the appended drawings. These drawings form a part of the specification. It is to be noted, however, that the appended drawings illustrate embodiments of the invention and therefore are not to be considered limiting in their scope.

FIG. 3 shows that with a top open pumping plate, the thickness uniformity is 0.79%. It is indicated that opening the pumping plate improves the uniformity.

DETAILED DESCRIPTION OF THE INVENTION

Disclosed herein is an emissivity-change-free pumping plate kit used for preventing the emissivity change during wafer processing which leads to process drift and particles. Problems such as powder formation in the inner chamber and blockage of pumping holes by powder are also addressed herein.

Figure 2:
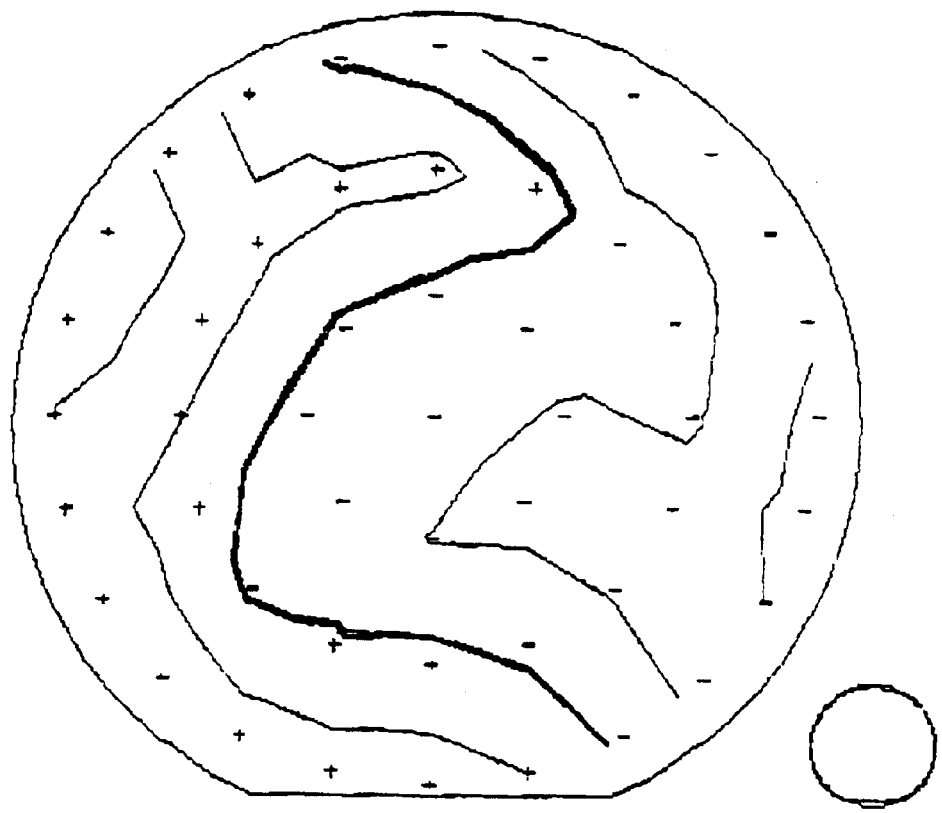
FIG. 2 shows that the uniformity is 1.37% using a standard pumping plate. This standard pumping plate of the prior-art does not have a top opening but holes. During the pumping, the purge gas goes through the holes.
Figure 5:
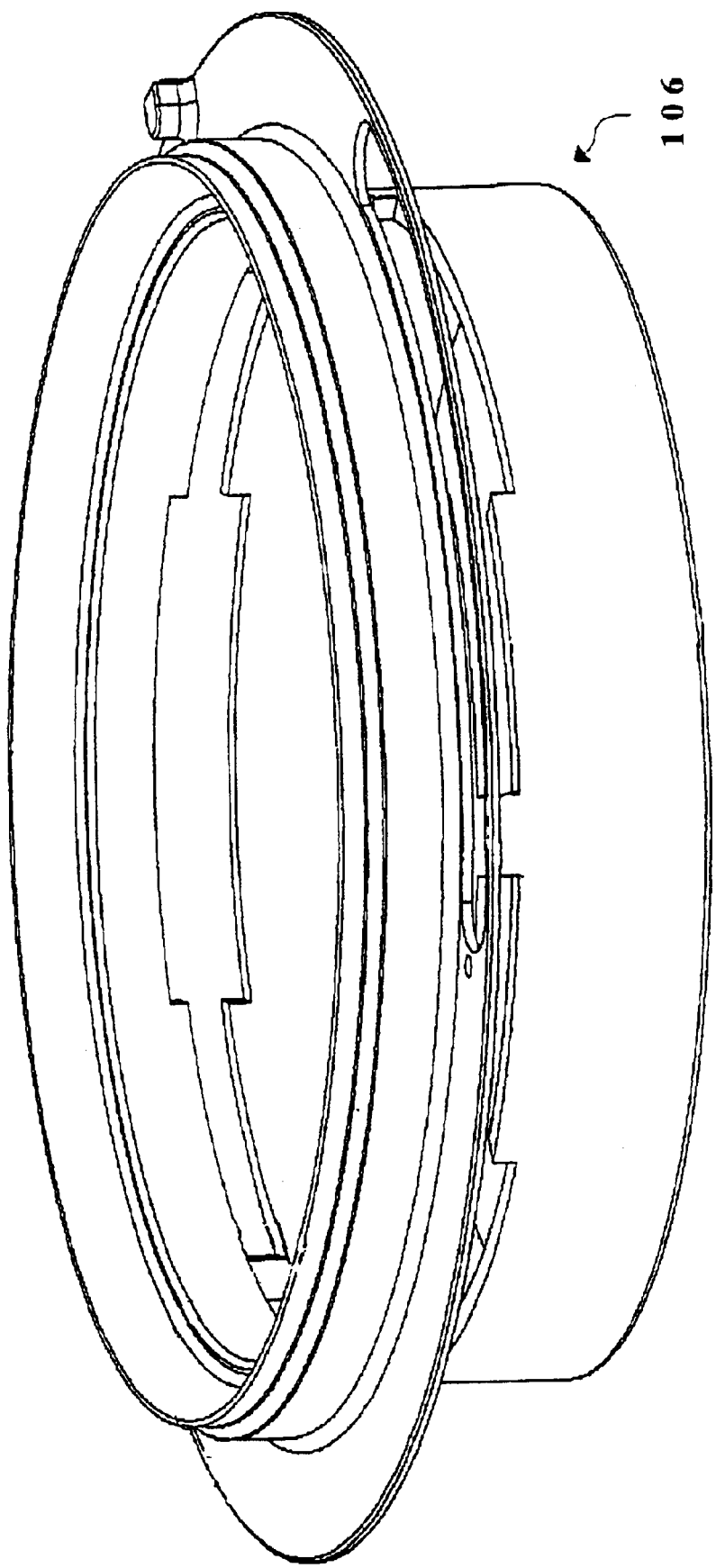
FIG. 5 is a 3-dimensional view of the top open pumping plate 106.

In the prior art for silicon (Si) deposition, a standard pumping plate is used, which has pumping holes for gas to flow through. FIG. 2 shows that with the standard pumping plate, the uniformity is 1.37%. During the deposition, yellow or black powders tend to accumulate on the pumping and face plates, which would cause emissivity change in the chamber and further temperature change. In order to improve the uniformity and meanwhile prevent emissivity change, a top open pumping plate is used in the present invention (see FIG. 5). With the top of the pumping plate fully open, purge gas can easily flow into the pumping channel and further eliminate the powder from the chamber. FIG. 3 shows that with a top open pumping plate, the thickness uniformity is 0.79%. It is indicated that opening the pumping plate improves the uniformity.

Additionally, during the deposition, the wafer heater tends to interact with the chamber body, which causes heat loss. In order to reduce the heat loss thereby improve the reliability and lifetime of the heater, a skirt is installed around the heater, underneath the heater, or along the chamber body inside the chamber. The skirt prevents the heater from interacting with the chamber body directly and makes the process condition more consistent from one chamber to another, therefore provides the same thermal boundary condition around the wafer heater and leads to optimal film thickness uniformity.

Figure 4:
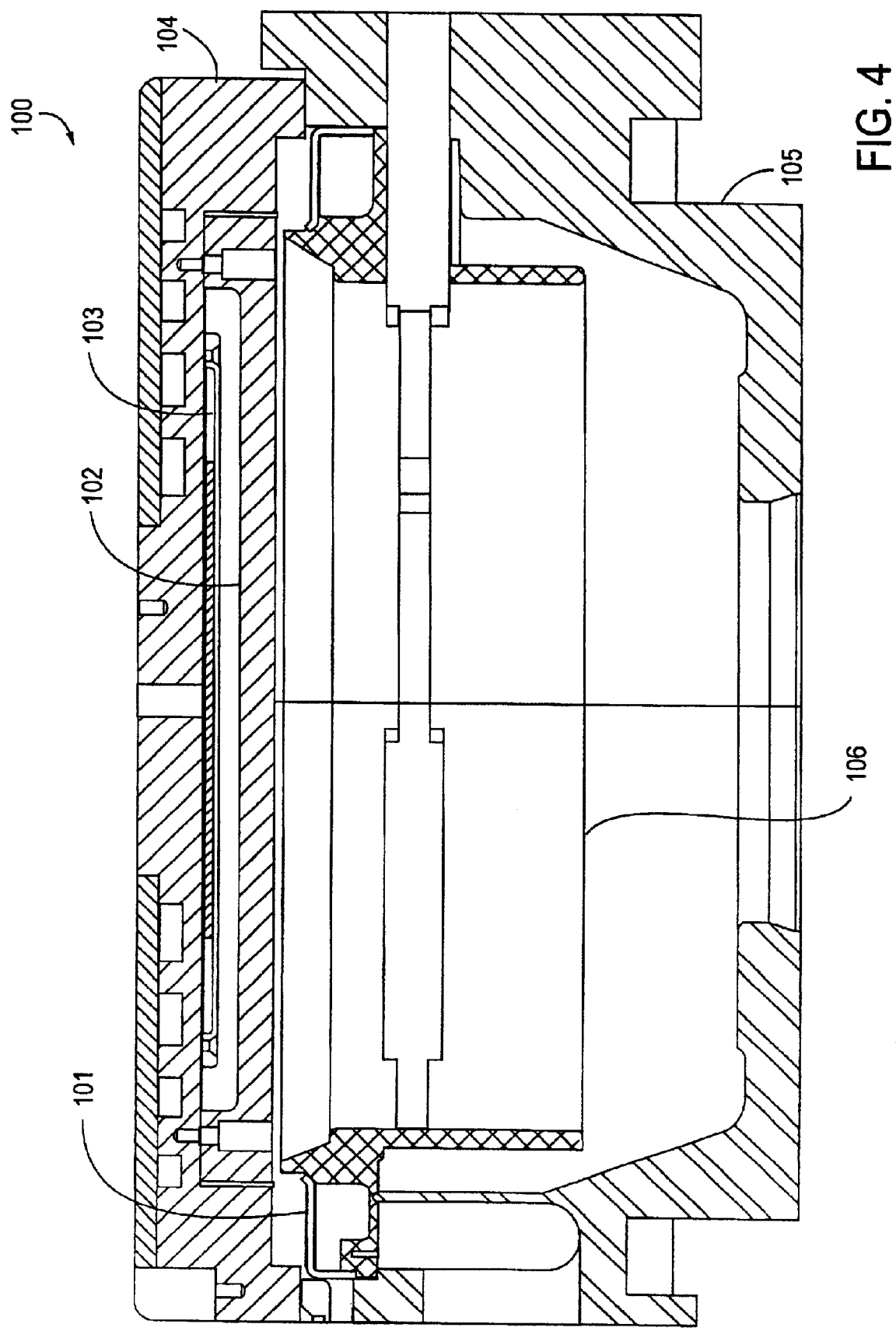
FIG. 4 is a cross-sectional view of POLYGen chamber 100, comprising pumping plate channel ring 101, face plate 102, blocker plate 103, chamber lid 104, chamber body 105, and pumping plate with top open 106. The pumping plate channel ring serves as a second stage choking plate. The purge gas enters the pumping plate from the bottom or the top of the chamber. With the top open, the gas flows freely out of the chamber.
Figure 6:
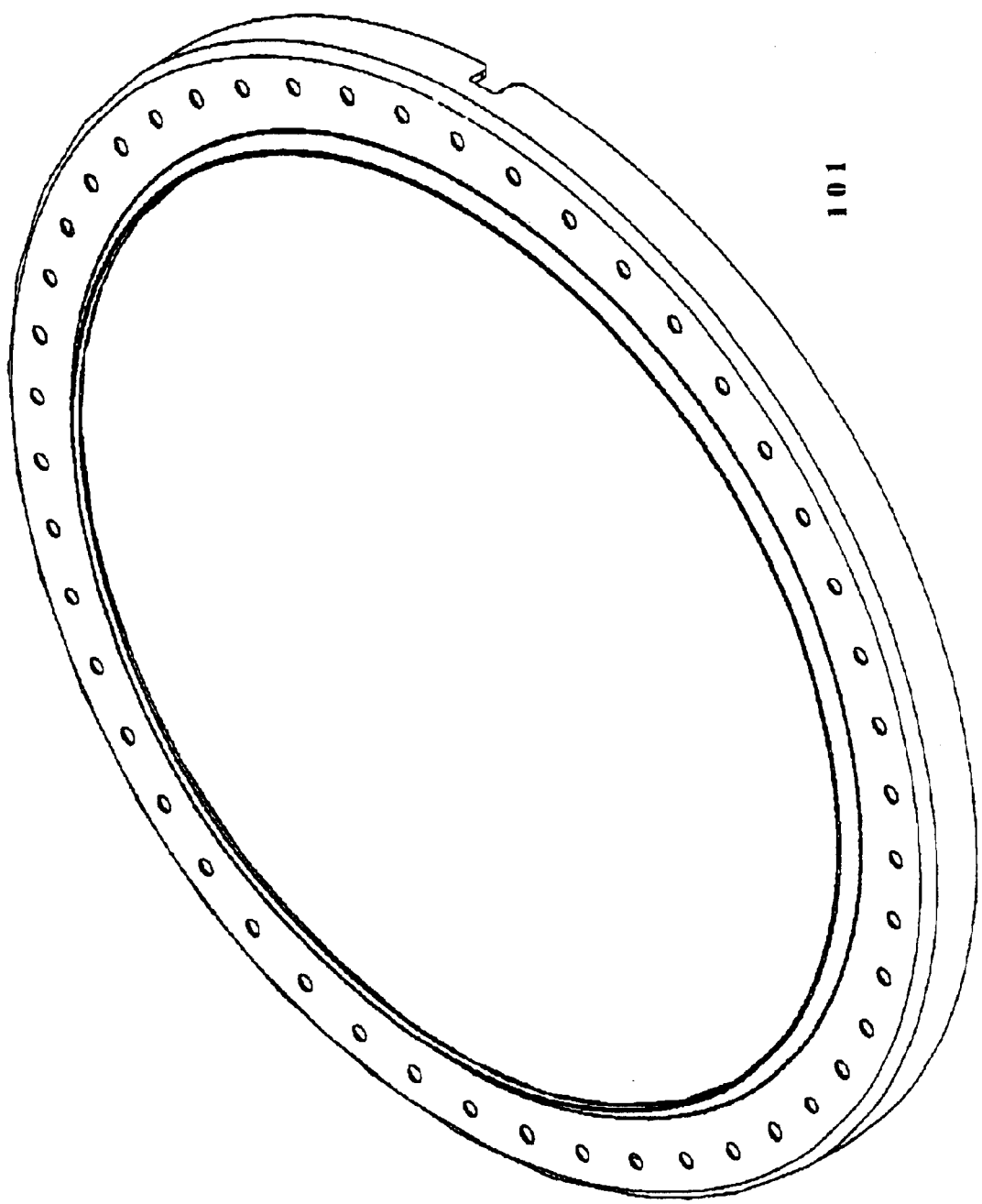
FIG. 6 is a 3-dimensional view of a uniform choking plate, wherein the holes are evenly spaced 101.

Another problem with the prior-art methodology for depositing silicon is that due to high deposition temperature, the chamber is constantly under high pressure, which makes it hard to control the exit gas flow uniformity. To solve this problem, a second pumping plate with reduced opening is hereby utilized in the present invention, which is installed downstream of the top open pumping plate along the purge gas flow (see pumping plate channel ring in FIG. 4). This second pumping plate provides choking effect for uniform exit gas pumping to ensure optimal thickness uniformity on the wafer. The choking plate can be uniform (see FIG. 6) or non-uniform. Uniform choking plate has evenly spaced holes, while non-uniform plate has more holes in one area and fewer in others.

As a specific example, a process chamber incorporating the above-described emissivity-change-free pumping plate kit is disclosed in one aspect of the present invention. The chamber is called POLYGen chamber 100, comprising a chamber body 105, a chamber lid 104, a top open pumping plate 106, pumping plate channel ring(s) 101 (i.e., second stage choking plate), a face plate 102, and a blocker plate 103 (see FIG. 4). A skirt (not shown) may be installed around the wafer heater (not shown), underneath the wafer heater, or along the chamber body 105 inside the chamber 100 and underneath the pumping plate 106. The emissivity-change-free pumping plate kit allows for two-stage pumping: at the first stage, the top open pumping plate 106 makes the pumping process freer and quicker as compared to a standard pumping plate. With purge gas being flown into the top open pumping plate 106 from the bottom of the chamber 100, powder formation is reduced on the pumping plate 106 and on the face plate 102. At the second stage, a choking effect is provided for uniform exit gas pumping to ensure optimal thickness uniformity on the wafer via a second pumping plate, which has reduced openings on the top. Standard purge gas may be used, such as $N_2$, Ar, and He.

In addition, the pumping channel designed provides a larger area for trapping the powders, which thus significantly reduces the possibility of blocking the pumping holes by powders. Furthermore, the emissivity-change-free pumping plate kit provides a uniform thermal boundary condition around the wafer heater (especially with the skirt), thus making the condition between the heater and the surrounding area consistent. This leads to optimal film thickness uniformity.

Figure 7:
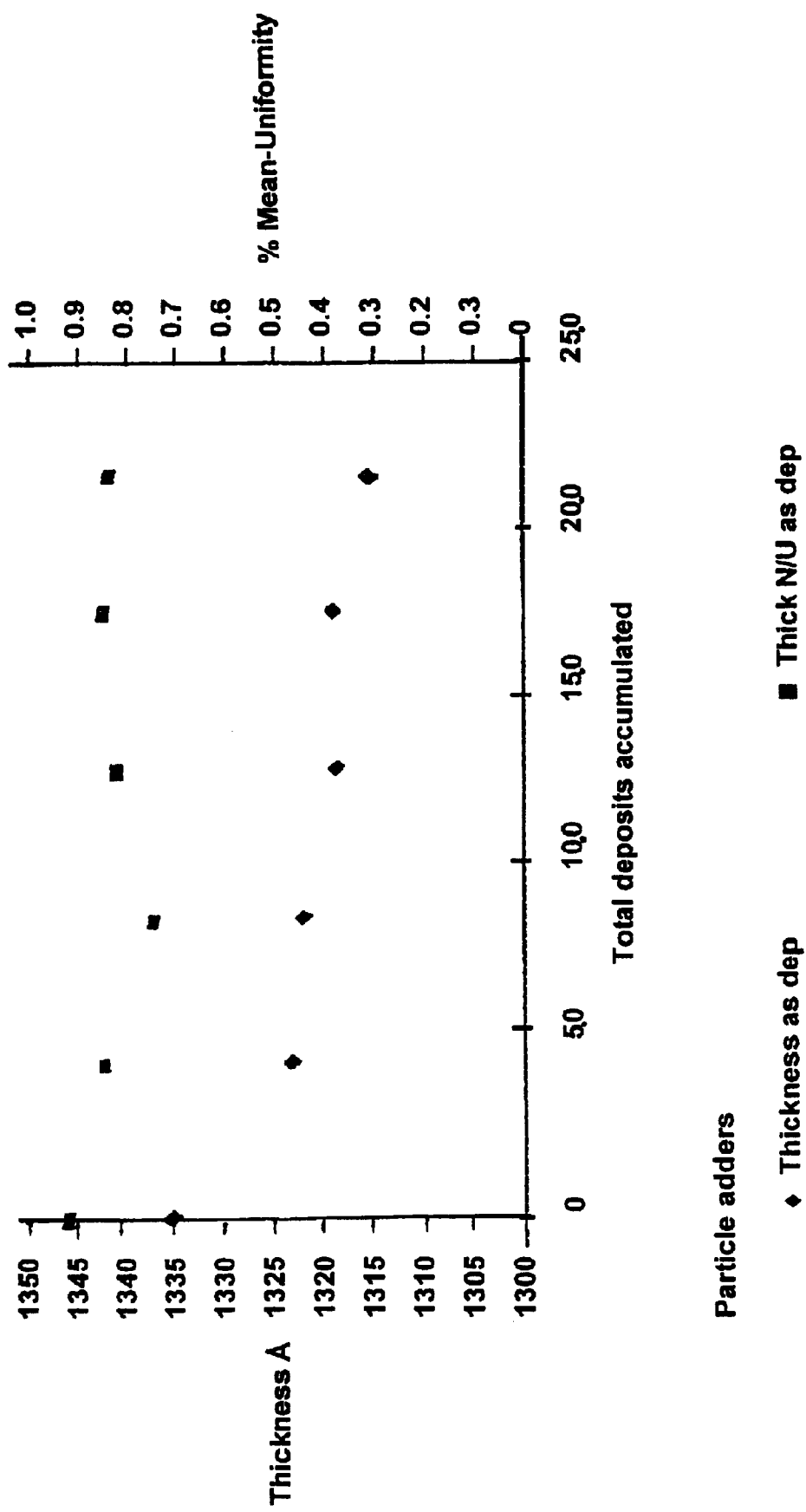
FIG. 7 is a plot of the data contained in Table 1, illustrating that the uniformity and thickness stayed the same as the total deposition of silicon approached 21 μm using the presently disclosed pumping plate kit during wafer processing.

Table 1 shows the test results from an emissivity change free pumping plate with top open and second stage choking plate. The smaller is the percentage of uniformity of thickness, the better is the uniformity (0=completely uniform). FIG. 7 is a plot of the data contained in Table 1.

TABLE 1

Test Results from Pumping Plate (top open with second stage choke)

| Si Dep. Th. (μm) | Th. (Å) | U. of Th. (%) |
|---|---|---|
| 0 | 1335 | 0.935 |
| 3.5 | 1323 | 0.840 |
| 8.0 | 1322 | 0.713 |
| 12.6 | 1318 | 0.776 |
| 17.1 | 1318 | 0.797 |
| 21.6 | 1314 | 0.788 |

Abbreviations: Dep. - deposition; U. - uniformity; Th. - thickness

Figure 1:
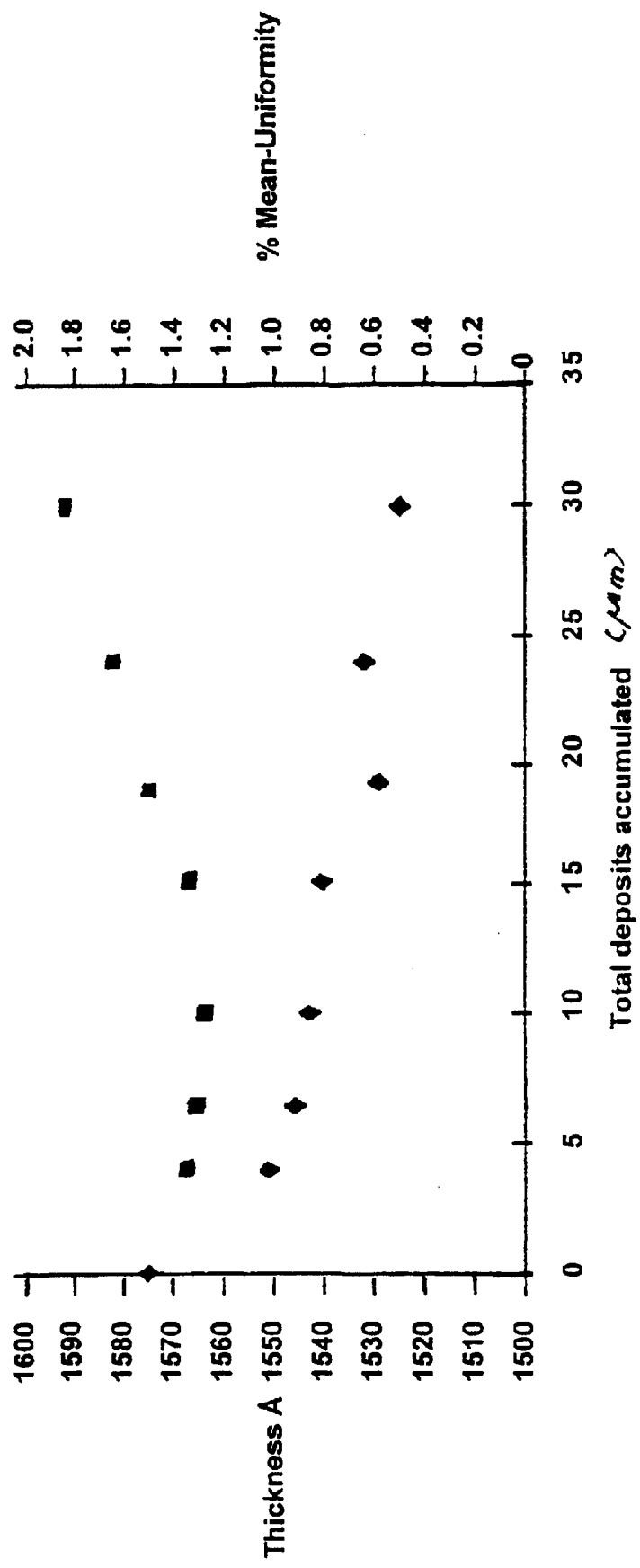
FIG. 1 shows 30 micron doped poly cycling using a standard pumping plate illustrating that cleaning was postponed until about 10 microns.

This shows that as the total deposition of silicon (Si) approached 21 μm, the uniformity and the thickness stayed the same. Using the presently disclosed pumping plate kit during wafer processing, the productivity is significantly improved for a P-doped polysilicon process from 5 μm total deposition per chamber dry clean (90 min each time for chamber clean) to more than 25 μm of total deposition per chamber clean (see FIGS. 1 and 7 for comparison). With reduced frequency of cleaning, the system throughput is increased. The pumping plate kit disclosed herein prevents the emissivity change, which leads to process drift. When there is no process drift, cleaning is not necessary.

As described above, provided herein in one aspect of the present invention is an emissivity-change-free pumping plate kit used in a single wafer chamber. This kit comprises a top open pumping plate (pumping plate), wherein there is no restriction to the flow. This kit may further comprise a skirt and/or a second stage choking plate. The skirt may be installed around the wafer heater, underneath the wafer heater, or along the chamber body inside the chamber and may be integral to the pumping plate. The choking plate can be installed downstream of the pumping plate along the purge gas flow. The choking plate may have uniform or non-uniform holes.

The interior of a wafer processing chamber can have a local area that reflects heat differently than from the remaining areas. Such non-symmetric reflection of heat within the process chamber can have adverse effects on the deposition of a film onto a wafer. One consequence of such non-uniformly reflected heat can be a film deposited onto the wafer having non-uniform material properties or non-uniform thicknesses. To minimize these potential problems with wafer film deposition, a body can be positioned into the interior of the wafer process chamber. Toward this end, a body having a special geometry, such as a non-symmetric shape to reflect heat non-uniformly and, as such, when correctly aligned relative to the local area, can compensate for such non-uniform heat reflections by the interior, is disclosed.

Such a body can be a pumping plate having a skirt where the skirt geometry is non-symmetric. A non-symmetric skirt can provide for both a uniform radial thermal boundary condition (uniform radial thermal boundary) around a susceptor and uniform temperatures within the susceptor overall, is disclosed. The susceptor can be centrally heated such that heat can flow to the susceptor edges and as a result, the susceptor temperature can drop as the susceptor edge is approached. A uniform thermal boundary can mean that a circular susceptor can have a uniform temperature at any radial location for any circumferential point located on that radius, i.e. a uniform radial thermal profile. In addition, the pumping plate can have a reduced thermal profile overall, i.e. throughout the pumping plate, and where the temperatures within this profile can have improved uniformity during processing.

In one embodiment, the pumping plate can have an integral skirt (i.e. pumping plate and skirt are one piece) containing holes such as slots that pass through the skirt and a reduced skirt length (short skirt) and where a section of the skirt can be entirely removed in the wafer loading area (wafer access slot). The through holes in the skirt can be round, oval (slots), or a variety of other shapes. The pumping plate is positioned within the process chamber such that skirt is properly aligned to balance the effects of radiation from a heated susceptor into a slit valve compared with susceptor radiation to areas not adjacent to the slit valve.

Figure 8A:
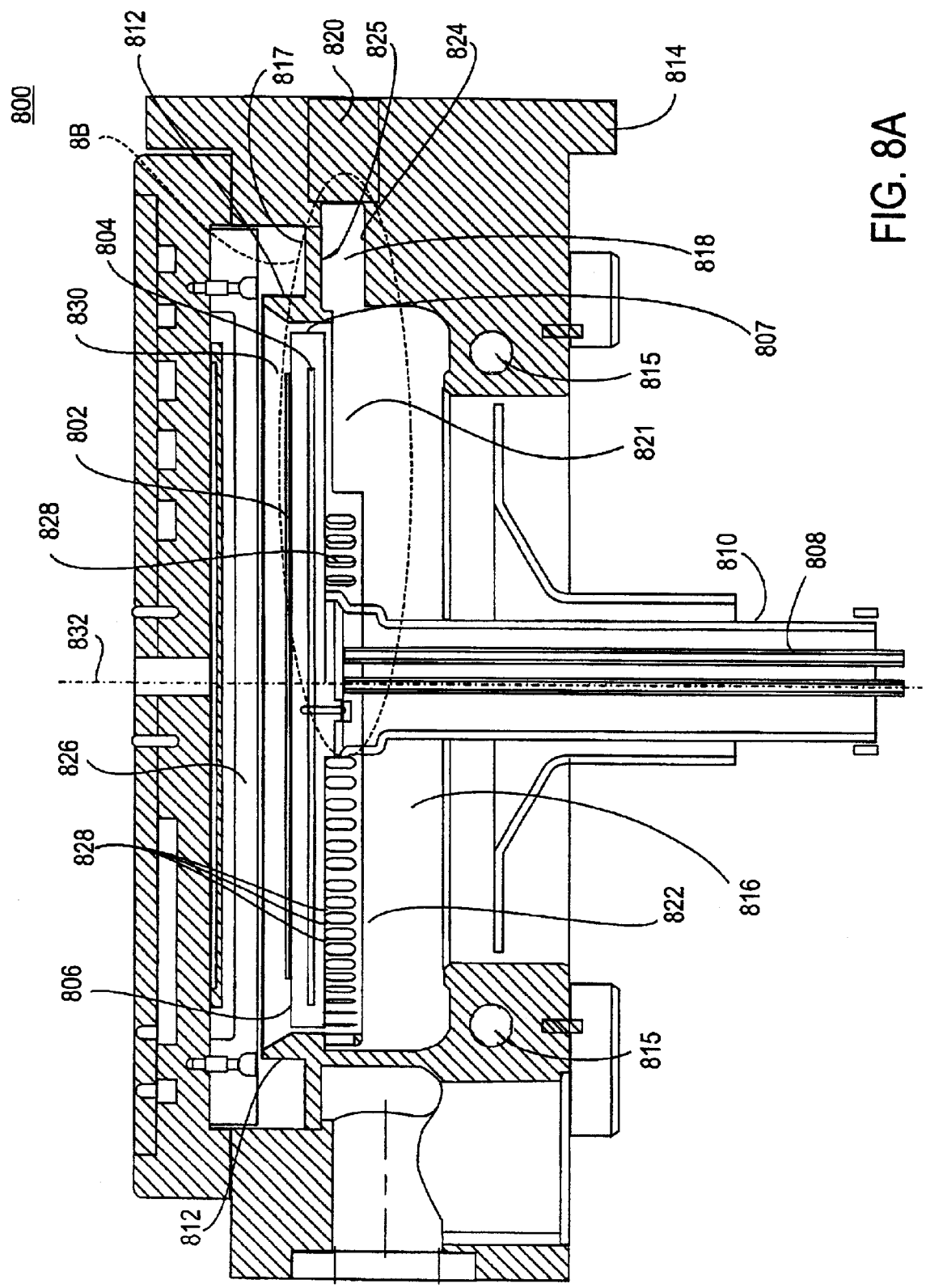
FIG. 8A is an illustration of a cross-section one embodiment of a process chamber containing a pumping plate with a skirt.
Figure 8B:
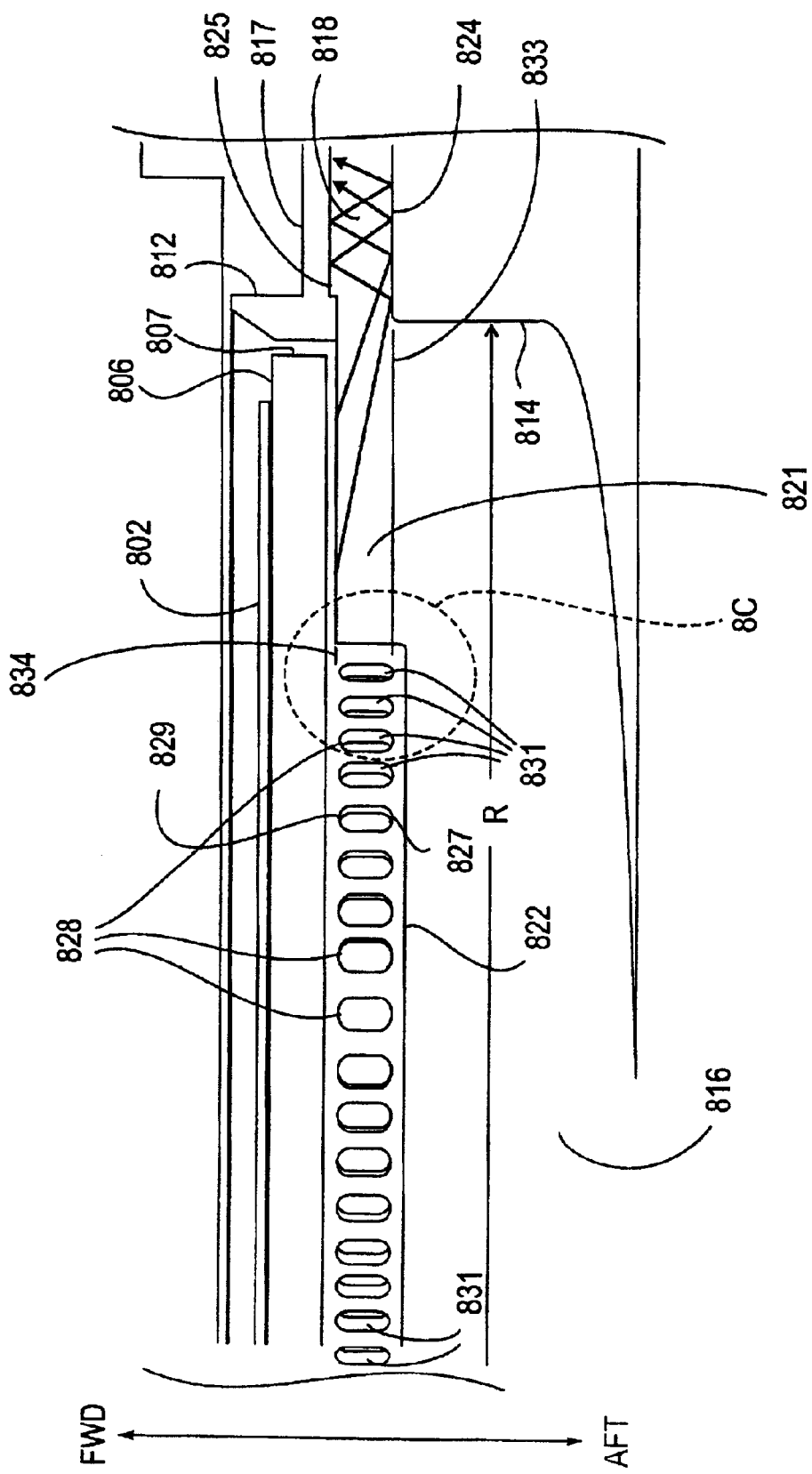
FIG. 8B is an illustration of a cross-section of a susceptor and the pumping plate area adjacent to a slit valve.
Figure 8C:
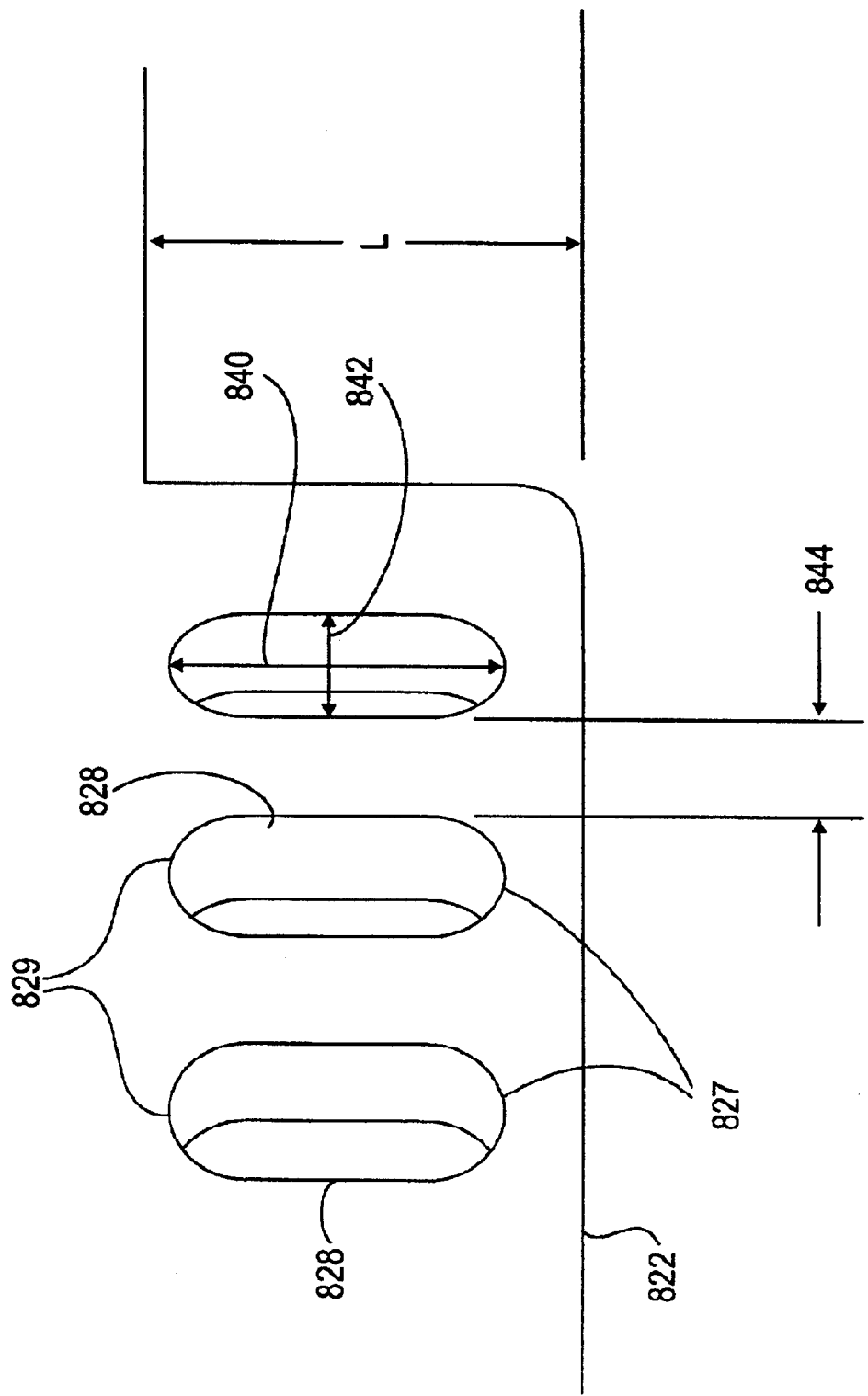
FIG. 8C is an illustration of a skirt edge adjacent to a wafer loading slot of the pumping plate.

FIG. 8A is a cross-sectional view of one embodiment of a process chamber containing a pumping plate with a skirt having slots. FIG. 8B is a cross-section of a susceptor and the pumping plate adjacent to a slit valve. FIG. 8C is an illustration of an edge of the pumping plate skirt. Referring to FIG. 8A, within the process chamber 800, such as, for example, the POLYGen chamber, a film coating may be deposited onto a wafer 802 by a process, such as, for example, CVD. The wafer 802 can be heated by the susceptor 806 using heating elements 804 buried within the susceptor 806 and/or resistive heating rods 808 positioned within an adjacent susceptor base 810. As a result, the wafer 802 is heated during processing as part of the film deposition process. After wafer processing, the susceptor 806 and susceptor base 810 can be lowered and pins (not shown) floating within the susceptor 806 can translate to raise the wafer 802 off the susceptor 806 for robot blade (not shown) removal from the process chamber 800.

During processing, heat can flow by conduction outward toward the surfaces and toward the outer diameter of the susceptor 806 to radiate into the chamber interior 816. Any non-uniformity in this outward flow of heat from the susceptor 806 can create a non-uniform heating environment for the wafer 802. A non-uniform heating environment on the wafer 802 can cause a non-uniform coating to be applied.

The interior volume of the process chamber 816 does not present uniform geometry for receiving the radiant heat from the susceptor 806. Because of this, the process chamber interior 816 can absorb radiant heat differently from the susceptor 806 at different locations, which can provide for differing amounts of heat to reflect back onto the susceptor 806 from these different locations. As a result, heat may leave the susceptor 806 at a rate that is different at one location than for another location on the susceptor 806. One use for the pumping plate 812 can be to provide a thermal constraint around the susceptor 806 that allows more uniformity for the sum total of heat leaving at and near the edges 807 of the susceptor 806. The shape of the pumping plate 812 is designed to offset the differing geometries within the process chamber 800 with a design that absorbs, passes, or reflects heat radiating from the susceptor 806 differently at different locations around the pumping plate 812. The result is to balance the net heat loss from the susceptor due to radiation into these different areas of the process chamber interior 816 with a pumping plate 812 geometry that varies circumferentially to compensate.

Referring to FIG. 8B, in particular, without compensating pumping plate 812 geometry, heat can be removed faster from the susceptor 806 by radiation into a local area know as the slit valve 818, a gap in the wafer process chamber interior 816 used for loading and unloading wafers 802 from the process chamber 800. Heat from the susceptor 806, radiating through wafer loading slot 821 in the pumping plate 812 and then into the slit valve 818, can reflect repeatedly between the two opposing slit valve surfaces 824 and 825. The result of such reflection can be in increase in heat absorption within the slit valve 818 due to a degree of black body absorption. Increased heat absorbed in the slit valve area 818 can result in less radiation bouncing back onto the susceptor 806. With greater absorption and less reflection, a higher rate of heat flow from the susceptor 806 area adjacent to the slit valve 818 can occur.

The addition of the skirt 822 to the pumping plate 812 can absorb heat and provide a circular barrier to heat radiating from the susceptor 806, i.e. a thermal boundary. The skirt 822 with slots 828 can absorb even more radiated heat from the susceptor 806 and further limit susceptor heat from reflecting off the chamber interior walls 814 back onto the susceptor 806. Because of this, heat can leave the susceptor 806 in areas adjacent to the skirt 822, at a faster rate. The skirt 822 can therefore substantially compensate for susceptor 806 heat loss into the slit valve 818 if the skirt slots 828 are placed at the same approximate axial location as the slit valve 818 (but will not be adjacent to the slit valve 818 since the wafer loading slot 821 is adjacent to the slit valve 818).

Heat absorbed by the pumping plate 812 can be conducted through an annular shaped pumping plate flange 817 into cooler areas (i.e. water cooled areas 815) of the chamber housing 814. Keep inmind, the skirt 822 is placed circumferentially around the pumping plate 812 except in the area of the slit valve 818 where access to the wafer 802 is required. Thus, the slotted skirt 822 can increase absorption of heat from the susceptor 806 to balance the black body absorption effect at the slit valve 818 resulting in a more uniform thermal boundary around the susceptor 806.

The efficiency of absorption by the skirt 822 can be increased through the use of openings or holes 828 in the skirt 822, here shown as vertical ellipse through holes (vertical slots) 828. Vertical ellipse referring to the major ellipse axis of the slot is positioned in the vertical (axial) direction. A portion of the heat radiated off the susceptor 806 can pass through the vertical slots 828. Heat radiating through the vertical slots 828 can be absorbed by the sidewall surfaces 831 forming the slots 828. A portion of the heat striking the sidewall surfaces 831 can be absorbed and a portion reflected. Some of the heat reflected from the sidewall surfaces 831 can strike the opposing sidewall 831 to be further absorbed and reflected. The result of these continued reflections of unabsorbed heat against the slot sidewall surfaces 831 can again be a black body effect providing increased absorption of heat by the skirt 822.

To effectively compensate, the total area of the vertical slots 828 may be approximately equal to the local area of the slit valve 818 where the slit valve 818 opens into the process chamber interior 816. For a process chamber interior 816 that is circular, such a slit valve 818 area may be defined by the distance between the two slit valve surfaces 824 and 825 when swung about an arc approximately in the range of 30°–120° at a radius R created from a chamber axis 832 to where the slit valve 818 mates with the chamber interior walls 814.

Referring to FIG. 8C, in one embodiment for processing 300 mm wafers, the slot 828 geometry can have a major axis (vertical axis 840) and a minor axis (horizontal axis 842) where the ratio of the major axis to the minor axis can be equal to or greater than one (i.e. major axis/minor axis=1). The slots 828 can be uniformly spaced around the skirt 822 where the spacing 844 between slots 828 can be in the range of approximately 0.1–0.5". For vertical slots, the slot major axis (vertical axis) can be approximately 0.50" and the slot minor axis can be approximately 0.25". The slots 828 can be positioned in the skirt 822 such that, when the pumping plate 812 is installed in the process chamber 800, the slots 828 can be approximately level with (same axial location) the slit valve 818. That is, each vertical slot aft end 827 and forward end 829 level with lines 833 and 834 extended from surfaces 824 and 825 respectively (FIG. 8B). The skirt 822 can have an inner diameter in the range of approximately 12–15" and the wafer access slot run circumferentially from between approximately 30–120 degrees. The skirt 822 thickness can be approximately 0.25" and the skirt axial length (L) approximately 1.0", where the skirt length is to be long enough to allow placement of the slots 828 level with the slit valve 818 (FIGS. 8A & 8B).

A pumping plate 812 sized with a slotted skirt 822 can minimize heat reflecting back from the process chamber interior walls 814. This allows for increased heat loss near the susceptor edges 807 in the areas not adjacent to the slit valve 818. As a result, heat absorbed by pumping plate 812, and in particular the skirt 822 can balance the local effect of heat radiating off the susceptor 806 directly into the slit valve 818.

However, design of the skirt 822 and slot 828 geometries, can be tailored to compensate for the effects of any varying geometry within the process chamber 816 and not just the slit valve 818. Referring again to FIG. 8A, one skilled in the art can appreciate that a spacing between the vertical slots 828 should be maintained. This is to provide sufficient area to conduct heat absorbed at the aft end of the skirt 822 around the slots 828 and toward the pumping plate flange 817 without bottleneck, i.e. without raising temperatures. Further, a skirt 822 thickness is required to provide enough area of sidewall surfaces 831 for absorption of the radiant heat passing through the slots 822 and also for overall heat conduction through the skirt 822 toward the flange 817.

As shown again in FIG. 8B, the pumping plate 812, when assembled into the process chamber 800, can position holes in the skirt, here slots, to be approximately level (axially) with the slit valve 818. This can mean the aft end of the vertical slots 828 in the skirt 822 can be approximately at the same axial position 833 as the bottom surface (floor) 824 of the slit valve 818. The forward end of the vertical slots 834 can be positioned at approximately the same axial 832 (FIG. 8A) position as the top surface 825 of the slit valve 818. This places the slots 828 overall to be level with the slit valve opening 818, however, due to wafer loading requirements that created this local heat absorption condition in the first place, the skirt 822 and the slots 828 are circumferentially removed in the area adjacent to the slit valve 818 to form the wafer loading slot 821.

Figure 8D:
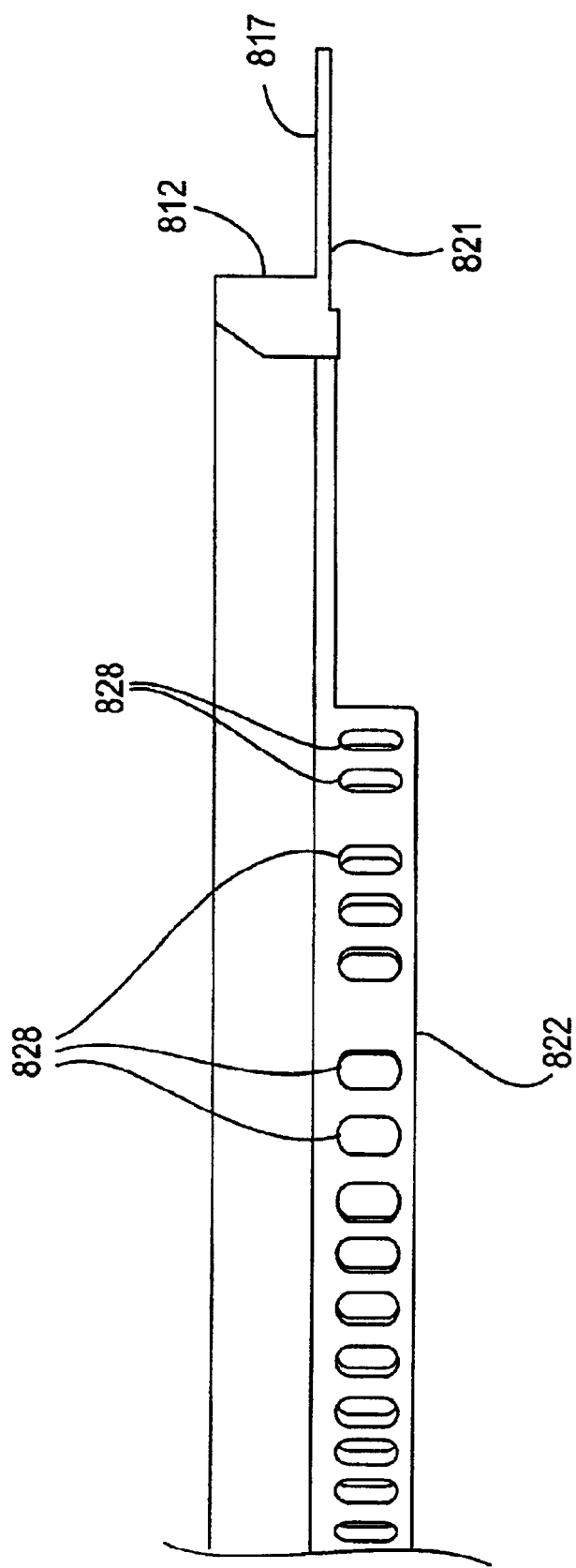
FIG. 8D is an illustration of one embodiment of a pumping plate having non-uniform slots within the skirt.

FIG. 8D is an illustration of non-uniform slot spacing. To compensate for any non-symmetric features within the process chamber interior 816, the slot 828 spacing can be increased or decreased uniformly or non-uniformly in the circumferential skirt 822 locations adjacent to those local internal features. The varied feature may be one of geometry or may be one of surface temperature. That is, a local hot or cold spot on the internal chamber wall 814 (FIG. 8A) that occurs during processing, other than the slit valve 818, may also be compensated for with an appropriate skirt 822 design.

Figure 8E:
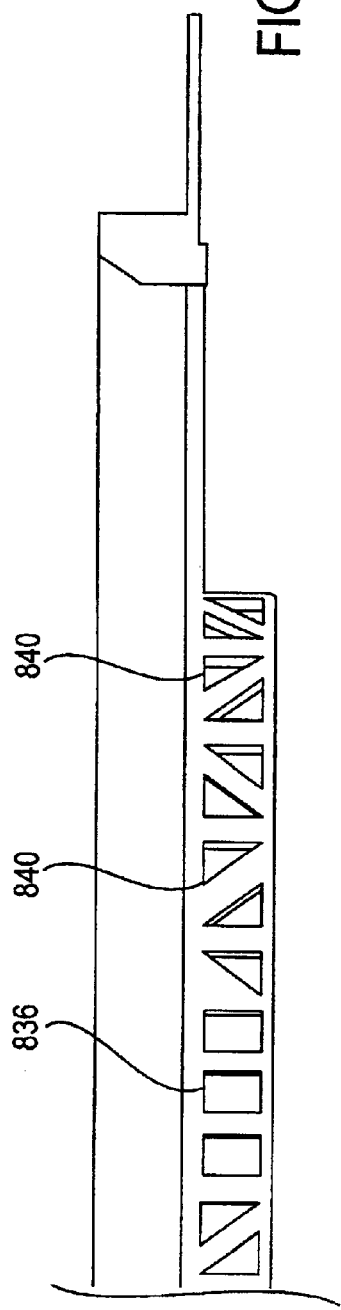
FIG. 8E is an illustration of one embodiment of holes in the pumping plate skirt.
Figure 8F:
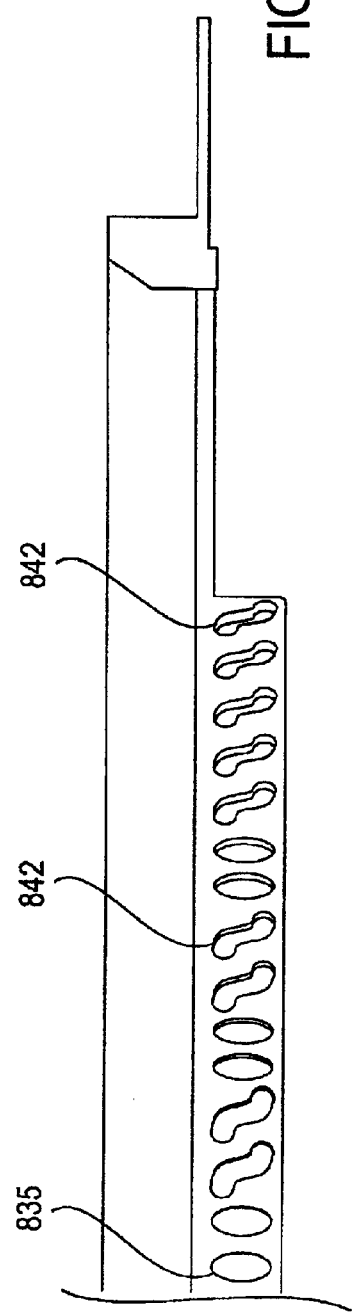
FIG. 8F is an illustration of another embodiment of holes in the pumping plate skirt.
Figure 8G:
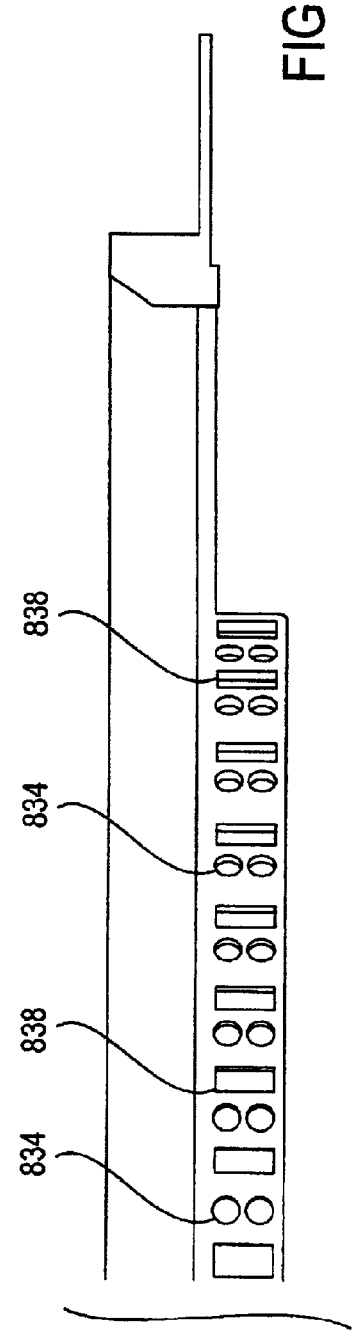
FIG. 8G is an illustration of yet another embodiment of holes in the pumping plate skirt.

As shown in FIGS. 8E–8G, it is to be appreciated that shapes for the heat absorbing holes in the skirt 822 can be of a variety of different shapes or combination of different shapes, where such shapes may be driven by a compromise of surface area required vs. cost of machining. Along with oval 835 and circular 834, other shapes may be considered such as square 836, rectangular 838, triangular 840, or even an opening that is formed by a non-symmetric curve 842.

Figure 9A:
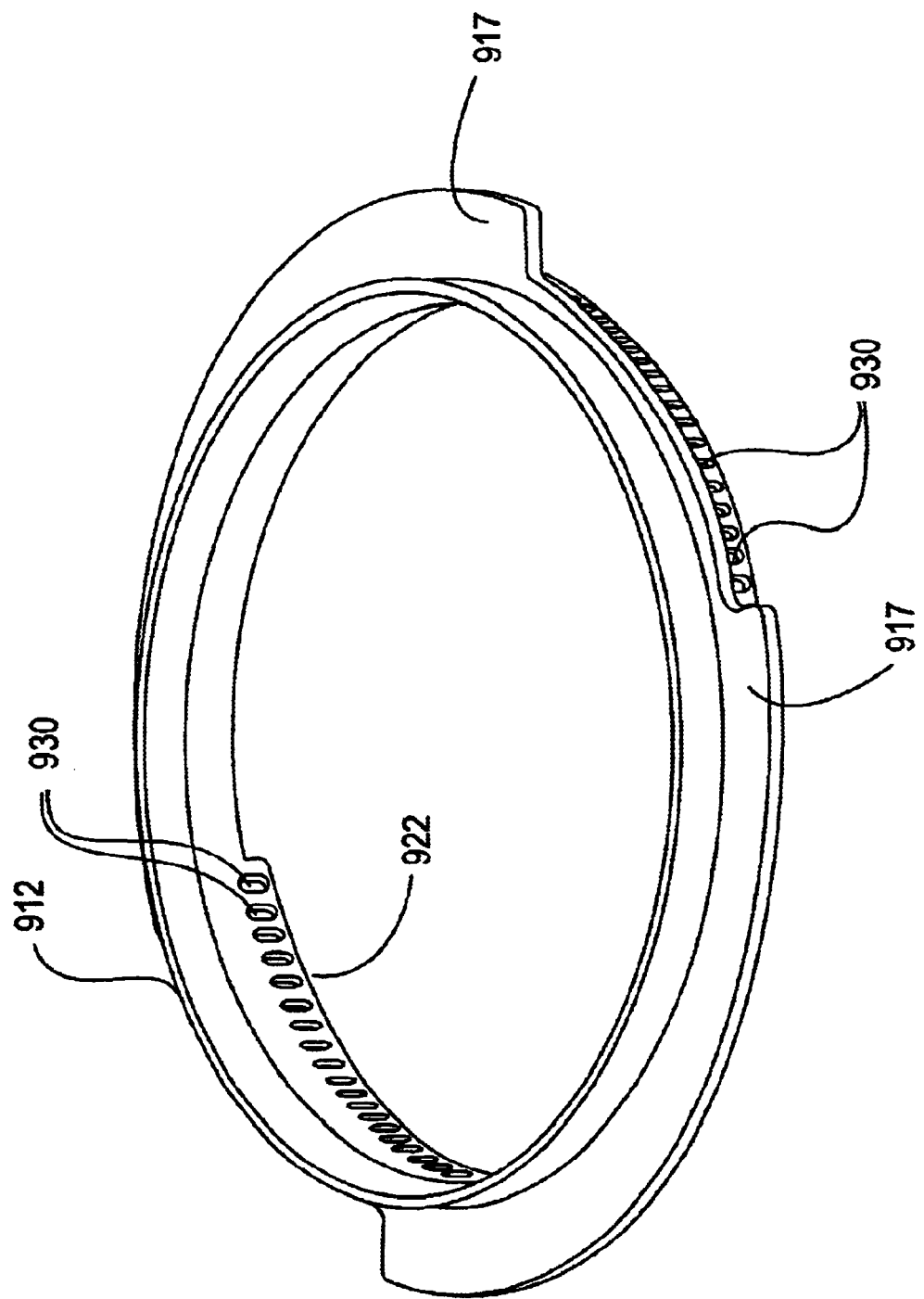
FIG. 9A is a 3D illustration of one embodiment of a pumping plate having a short-skirt.
Figure 9B:
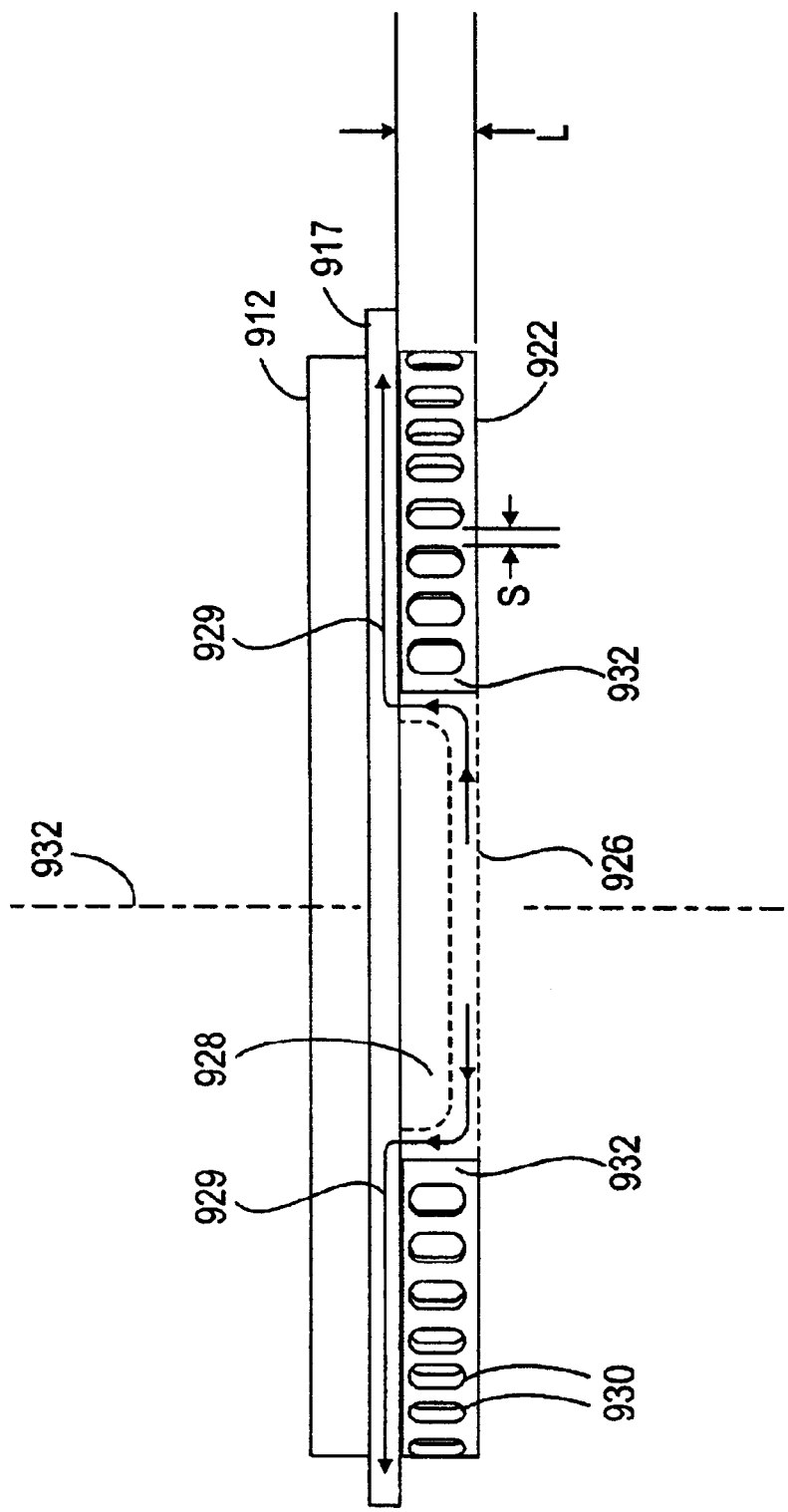
FIG. 9B is a cross-section illustration of the one embodiment of the pumping plate having the short-skirt.

FIG. 9A is a 3D illustration of one embodiment of a pumping plate having a short-skirt. FIG. 9B is a cross-section illustration of the one embodiment of the pumping plate having the short-skirt. The skirt 922 and a number of holes, here vertical slots 930, can balance the local effects of higher or lower heat absorption resulting from non-uniform conditions within the process chamber interior 816 (FIG. 8A). However, it is also important to minimize the temperatures within the pumping plate 912 during processing. Along with lower pumping plate 912 temperatures, temperature uniformity is also important during processing. Lowering the temperatures in the pumping plate 912 during processing can reduce the possibility of the pumping plate 912 material adding impurities into the chamber process 800 (FIG. 8A) to contaminate the wafer or the wafer film being deposited. The pumping plate 912 can be manufactured from aluminum that can have an anodized coating, however one skilled in the arts should realize that other materials such as stainless steel can be used. Higher temperatures in the pumping plate 912 can crack or flake coatings (if used) on the pumping plate 912 such as the anodize coating. With the underlying bare metal exposed, it is possible for some of the metal to become airborne as contaminants.

Referring to FIG. 9B, when removing the section of the skirt 926 (dashed) at the wafer access slot 928, as opposed to providing a complete horizontal slot, heat does not have to travel 929 around the slot 928 to reach the flanges 917. Such thermal flow would create a "hot spot" in the bottle-necked areas between the slots 930 adjacent to the wafer access slot 928. With this section 926 of the skirt 922 removed, heat is not absorbed in this area, and therefore will not add to the heat flow at adjacent slot areas 932 and which would increase the temperatures. In addition, with the wafer access slot 821 open at the aft end 830, the overall length L of the skirt can be shortened (short skirt). This can allow for skirt length L to be driven by the hole size, here the slot major axis, necessary to line up with the slit valve 818 (FIG. 8B). This skirt slot axial lineup with the slit valve, along with the sum of the areas of the slots approximately equaling the area of the slit valve, being a rule of thumb that can provide approximate compensation for the heat loss into the slit valve 818.

It is within the ability of one skilled in the art to deter mine a distance s between vertical slots 930 for allowing a thermal flow that minimizes the temperatures in the skirt 922. The distance s may be uniform, varied uniformly, varied non-uniformly, or may be spaced in a variety of other ways to provide uniform heating of the skirt 922.

The length L of the skirt 922 can be sized to reduce temperatures within the pumping plate 912 by offering less surface area for heat absorption and yet still provide a screen for direct radiant heating from the susceptor 806 (FIG. 8A above) onto portions of the chamber interior walls (not shown). As a result of this geometry, the pumping plate 912 can be maintained at temperatures approximately below 250° C., where the pumping plate 912 temperature is uniform to within approximately ±30° C. when the process chamber is operating at temperatures in the range of approximately 550–800° C.

Figure 10C:
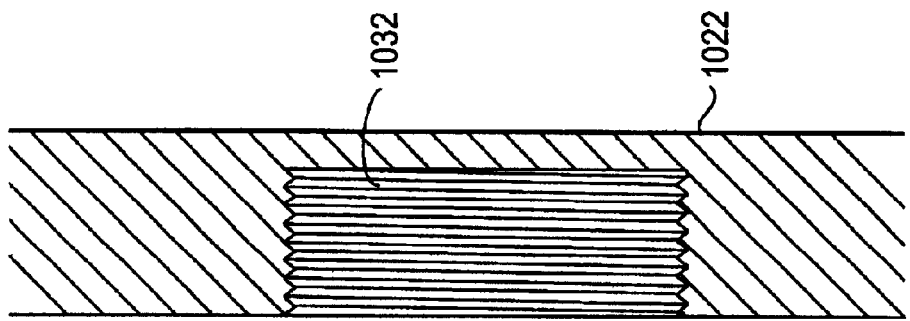
FIG. 10C is an illustration of a slot that is a threaded flat bottom hole.
Figure 10B:
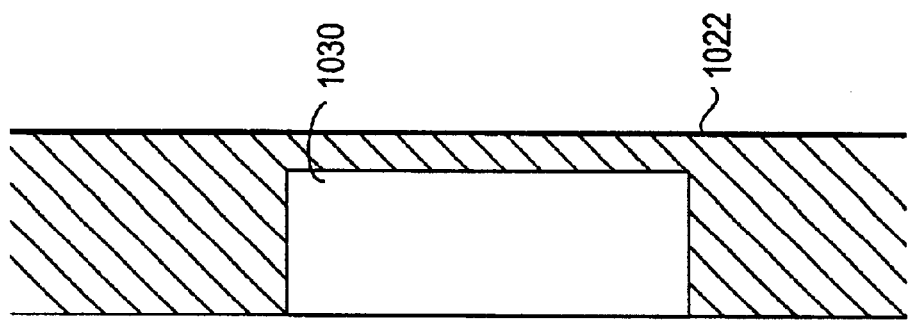
FIG. 10B is an illustration of a slot that is a flat bottom hole.
Figure 10A:
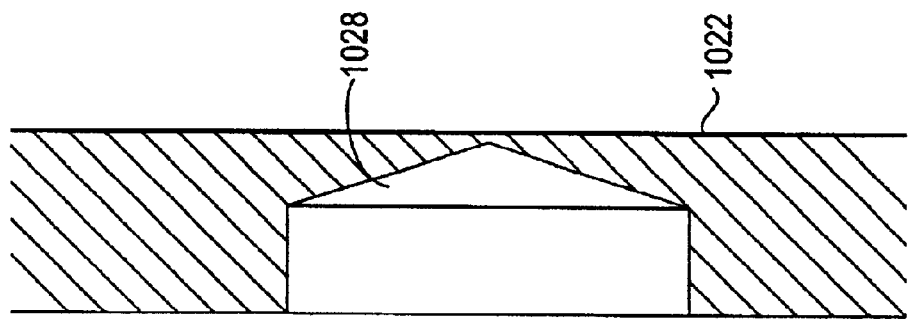
FIG. 10A is an illustration of a slot that is a tapped bottom hole.

FIGS. 10A–10C are illustrations of alternate embodiments of skirt slots that do not go through the skirt 1022. FIG. 10A is an illustration of a slot 1028 that is a tapped bottom hole. FIG. 10B is an illustration of a slot 1030 that is a flat bottom hole. FIG. 10C is an illustration of a slot that is a threaded flat bottom hole 1032. In one embodiment, one or more of the slots 1028, 1030, and 1032 may not go completely through the skirt 1022 and where the slot openings 1028, 1030, and 1032 can face the susceptor (FIG. 8A) when the pumping plate is installed into the process chamber. It is possible for a skirt 1022 to function using slots 1028, 1030, and 1032 that do not go through the skirt 1022, however, the benefits of manufacturability as well as for obtaining maximum sidewall surface areas 831 (FIG. 8B) may make this design less favorable as opposed to holes that go through the skirt 1022.

The emissivity-change-free pumping plate kit disclosed herein may be used for preventing an emissivity change during wafer processing by providing a gas purge to the chamber so as to prevent residual or powder formation on the pumping and face plates, thereby preventing an emissivity change in the chamber. The pumping plate may also be used for improved film thickness and film material property uniformity during wafer processing, wherein heat is removed from a heated susceptor more uniformly. Such thermal uniformity can result from a uniform thermal boundary condition provided around the susceptor, which can lead to a uniform film deposition onto the wafer. The pumping plate may have a reduced average operating temperature, and along with a more uniform operating temperature for the pumping plate, the chance of metal contamination in the process chamber from the base metal becomes less likely.

One skilled in the art will readily appreciate that the present invention is well adapted to carry out the objects and obtain the ends and advantages mentioned, as well as those inherent therein. It will be apparent to those skilled in the art that various modifications and variations can be made in practicing the present invention without departing from the spirit or scope of the invention. Changes therein and other uses will occur to those skilled in the art which are encompassed within the spirit of the invention as defined by the scope of the claims.

What is claimed is:

1. An apparatus, comprising:
    a pumping plate having a skirt, wherein the skirt contains a plurality of holes and a wafer access slot.

2. The apparatus of claim 1, wherein the wafer access slot is open at an edge of the skirt.

3. The apparatus of claim 2, wherein a total area of the plurality of holes is approximately equal to an area of the slit valve where the slit valve opens to an interior of the process chamber.

4. The apparatus of claim 1, wherein the plurality of holes are through holes.

5. The apparatus of claim 1, further comprising:
    a process chamber;
    a slit valve; and wherein the pumping plate is positioned in the process chamber, the wafer access slot is adjacent to the slit valve, and the plurality of holes have an axial height approximately equal to an axial height of the slit valve.

6. The apparatus of claim 5, wherein the plurality of holes are at the same axial location as the slit valve.

7. The apparatus of claim 5, wherein the plurality of holes have a hole axial height-to-hole width ratio of approximately greater than or equal to one.

8. The apparatus of claim 1, wherein the pumping plate is capable of maintaining a temperature approximately below 250° C., ±30° C., when a susceptor heater temperature is in the range of approximately 550–800° C.

9. The apparatus of claim 1, wherein the plurality of holes are uniformly spaced.

10. The apparatus of claim 1, wherein the plurality of holes are non-uniformly spaced.

11. The apparatus of claim 1, wherein the plurality of holes are comprising more than one shape.

12. The apparatus of claim 11, wherein the more than one shape of the plurality of holes is chosen from the group consisting of circle, ellipse, rectangle, square, and non-uniform curve.

13. An apparatus, comprising:

a wafer process chamber;

an local area in the interior of the wafer process chamber that reflects heat less than the remainder of the interior;

a body installed within the interior that reflects heat non-symmetrically such that when aligned with the local area, the body thermally compensates for the lower heat reflection by the local area.

14. The apparatus of claim 13, wherein the local area is a slit valve and body is a skirt having a plurality of holes.

15. The apparatus of claim 14, further comprising:

a susceptor;

a susceptor heater;

a blocking plate; wherein the susceptor is heated with heat conducting to the surfaces of the susceptor and where as a result of the location of the plurality of holes and a skirt shape, the skirt absorbs radiated heat non-uniformly to thermally compensate for the reduced heat reflection from the slit valve and provides a uniform thermal boundary around the susceptor.

16. The apparatus of claim 15, wherein the plurality of holes are shaped to improve the uniform thermal boundary around the susceptor.

17. The apparatus of claim 16, wherein the plurality of holes have a plurality of shapes.

18. The apparatus of claim 14, further comprising the skirt having a wafer access slot that is open at the aft end of the skirt such that the overall pumping plate temperatures during processing are uniform.

19. The apparatus of claim 14, further comprising a short skirt such that the overall pumping plate temperatures are reduced.

20. An apparatus comprising:

a process chamber;

a susceptor;

a pumping plate;

a skirt; and means for creating a uniform boundary around the susceptor by compensating for local heating effects within the process chamber.

21. The apparatus of claim 20, further comprising:

means for reducing the temperatures within the pumping plate.

22. The apparatus of claim 21, further comprising:

means for providing temperature uniformity with the pumping plate.

23. The apparatus, comprising:

a circular susceptor;

a face plate and a blocker plate positioned above the susceptor;

a susceptor heating mechanism;

a slit valve;

a pumping plate;

a pumping plate skirt having a plurality of through holes;

a wafer access slot within the pumping plate skirt that is open at an edge of the pumping plate skirt; and a shortened length of the skirt to reduce the temperature profile within the pumping plate during processing.

24. The apparatus of claim 23, wherein the plurality of through holes in the skirt are positioned to provide temperature uniformity during processing.

* * * * *